US008771560B2

(12) United States Patent
Kretzer et al.

(10) Patent No.: US 8,771,560 B2
(45) Date of Patent: Jul. 8, 2014

(54) PROCESS FOR THE MANUFACTURE OF DOPED SEMICONDUCTOR SINGLE CRYSTALS, AND III-V SEMICONDUCTOR SINGLE CRYSTAL

(75) Inventors: Ulrich Kretzer, Chemnitz (DE); Stefan Eichler, Dresden (DE); Thomas Bünger, Lüneburg (DE)

(73) Assignee: Freiberger Compound Materials GmbH, Freiberg (DE)

( * ) Notice: Subject to any disclaimer, the term of this patent is extended or adjusted under 35 U.S.C. 154(b) by 0 days.

(21) Appl. No.: 12/034,345

(22) Filed: Feb. 20, 2008

(65) Prior Publication Data

US 2008/0203362 A1 Aug. 28, 2008

Related U.S. Application Data

(62) Division of application No. 11/478,450, filed on Jun. 30, 2006, now Pat. No. 7,410,540.

(60) Provisional application No. 60/697,860, filed on Jul. 8, 2005.

(30) Foreign Application Priority Data

Jul. 1, 2005 (DE) .......................... 10 2005 030 853

(51) Int. Cl.
*H01B 1/02* (2006.01)
*H01B 1/08* (2006.01)
*H01B 1/06* (2006.01)
*C30B 9/00* (2006.01)
*C30B 11/00* (2006.01)
*C30B 17/00* (2006.01)
*C30B 21/02* (2006.01)
*C30B 28/06* (2006.01)

(52) U.S. Cl.
USPC ................ 252/521.3; 252/518.1; 252/519.51; 252/519.52; 252/521.4; 117/81; 117/954

(58) Field of Classification Search
CPC .......... C30B 29/40; C30B 29/42; H01B 1/02; H01L 21/02538
USPC ............. 252/518.1, 519.5, 521.3, 521.5, 500, 252/519.51, 519.52, 521.4; 117/81, 954; 423/1
See application file for complete search history.

(56) References Cited

U.S. PATENT DOCUMENTS

| | | | |
|---|---|---|---|
| 3,496,118 A | 2/1970 | Willardson et al. | |
| 3,777,009 A | 12/1973 | Menashi et al. | |
| 4,592,793 A | 6/1986 | Hovel et al. | |
| 4,776,971 A | 10/1988 | Mattera et al. | |
| 4,911,780 A | 3/1990 | Morioka et al. | |
| 4,999,082 A * | 3/1991 | Kremer et al. | 252/62.3 GA |
| 5,186,784 A | 2/1993 | Rau et al. | |
| 5,223,449 A * | 6/1993 | Morris et al. | 438/188 |
| 5,376,580 A | 12/1994 | Kish et al. | |
| 5,471,938 A | 12/1995 | Uchida et al. | |
| 5,612,014 A | 3/1997 | Inoue et al. | |
| 6,287,478 B1 | 9/2001 | Klocek | |
| 6,325,849 B1 * | 12/2001 | Hideo et al. | 117/82 |
| 6,692,568 B2 | 2/2004 | Cuomo et al. | |
| 6,784,085 B2 | 8/2004 | Cuomo et al. | |
| 7,214,269 B2 | 5/2007 | Wachi et al. | |
| 7,410,540 B2 | 8/2008 | Kretzer et al. | |
| 8,329,295 B2 | 12/2012 | Kretzer et al. | |
| 2002/0078881 A1 | 6/2002 | Cuomo et al. | |
| 2002/0086534 A1 | 7/2002 | Cuomo et al. | |
| 2003/0200913 A1* | 10/2003 | Kawase et al. | 117/20 |
| 2004/0187768 A1* | 9/2004 | Itani et al. | 117/81 |
| 2006/0081306 A1* | 4/2006 | Wachi et al. | 148/33 |

FOREIGN PATENT DOCUMENTS

| | | |
|---|---|---|
| DE | 10 2004 015 863 A1 | 4/2005 |
| JP | 2001-354499 A | 7/1986 |
| JP | 61-215300 | 9/1986 |
| JP | 03-080199 A | 4/1991 |
| JP | 06-219900 A | 8/1994 |
| JP | 06-302857 A | 10/1994 |
| JP | 08-048592 A | 2/1996 |
| JP | 08-162378 A | 6/1996 |
| JP | 10-044139 A | 2/1998 |
| JP | 10-279398 A | 10/1998 |
| JP | 11-268998 A | 10/1999 |

(Continued)

OTHER PUBLICATIONS

Korean Patent Abstract, KR 101992010134 B1, Goldstar Cable Co., Nov. 16, 1992.

(Continued)

*Primary Examiner* — Harold Pyon
*Assistant Examiner* — Tanisha Diggs
(74) *Attorney, Agent, or Firm* — Foley & Lardner LLP (57) ABSTRACT

In a process for manufacturing doped semiconductor single crystal comprises solidifying in a crucible, the amount of dopant is added into the semiconductor melt after the beginning of the crystal growth onto the seed crystal, or after at least partial solidification of the semiconductor single crystal in a conical or tapered portion of the crucible. Dopant may be partially added in advance into the crucible, with the remainder added into the semiconductor melt as described. Type III-V semiconductor single crystals or wafers having a diameter of at least about 100 mm, can be prepared having an electrical conductivity of at least about 250 Siemens/cm, and/or an electric resistivity of at most about $4\times10^{-3}$ Ωcm, and/or a significantly improved ratio of hall mobility to charge carrier concentration.

13 Claims, 4 Drawing Sheets

(56) References Cited

FOREIGN PATENT DOCUMENTS

| | | | |
|---|---|---|---|
| JP | 2000-086398 A | 3/2000 | |
| JP | 2000-109400 A | 4/2000 | |
| JP | 2000-313699 A | 11/2000 | |
| JP | 2001-199790 A | 7/2001 | |
| JP | 2001-354499 A | 12/2001 | |
| JP | 2002-255697 A | 9/2002 | |
| JP | 2003-206200 A | 7/2003 | |
| JP | 2004-099390 A | 4/2004 | |
| JP | 2004-115305 A | 4/2004 | |
| JP | 2004-115339 A | 4/2004 | |
| JP | 2004-119423 A | 4/2004 | |
| JP | 2004115339 A | * | 4/2004 |
| JP | 2004-137096 A | 5/2004 | |
| JP | 2004-217508 A | 8/2004 | |
| JP | 2004-523450 A | 8/2004 | |
| WO | WO 02/44443 A1 | 6/2002 | |
| WO | WO 2005/007939 A1 | 1/2005 | |

OTHER PUBLICATIONS

R. Fornari et al., "Dislocation-Free Silicon-Doped Gallium Arsenide Grown by LEC Procedure," Journal of Crystal Growth, vol. 63, 1983, pp. 415-418.

I.C. Bassignana et al., "Variation in the lattice parameter and crystal quality of commercially available Si-doped GaAs substrates," Journal of Crystal Growth, vol. 178, 1997, pp. 445-458.

J.B. Mullin et al., "A Study on the Relationship Between Growth Technique and Dopants on the Electrical Properties of GaAs with Special Reference to LEC Growth," Journal of Crystal Growth, vol. 50, 1980, pp. 625-637.

T. Bünger et al., "Development of a vertical gradient freeze process for low EPD GaAs substrates," Materials Science Engineering, vol. B80, 2001, pp. 5-9.

ASTM International Designation: F 76-86, "Standard Test Methods for Measuring Resistivity and Hall Coefficient and Determining Hall Mobility in Single-Crystal Semiconductors," 2002, pp. 1-13.

U. Kretzer, U.S. PTO Notice of Allowance, U.S. Appl. No. 12/500,037, dated Aug. 16, 2012, 11 pages.

H. C. Casey, Jr. et al., "Concentration dependence of the absorption coefficient for $n$ and $p$-type GaAs between 1.3 and 1.6.eV", Journal of Applied Physics, vol. 46, No. 1, Jan. 1975, pp. 250-257.

U.S. Appl. No. 12/500,037, filed Jul. 9, 2009, Kretzer et al.

U. Kretzer, U.S. PTO Office Action, U.S. Appl. No. 12/500,037, dated Feb. 29, 2012, 14 pgs.

A. S. Jordan, "Determination of the total emittance of n-type GaAs with application to Czochralski growth", Journal of Applied Physics 51, 4 (1980), pp. 2218-2227.

W. G. Spitzer et al., "Infrared absorption and electron effective mass in n-type gallium arsenide," Physical Review 114, 1 (1959) pp. 59-63.

J. S. Blakemore, "Semiconducting and other major properties of gallium arsenide", Journal of Applied Physics 53, 10 (1982), pp. R123-R181.

G. M. Martin, "Optical assessment of the main electron trap in bulk semi-insulating GaAs," Applied Physics Letters 39, 9 (1981), pp. 747-748.

K. Elliot et al., "Identification of $As_{Ga}$ antisite defects in liquid encapsulated Czochralski GaAs," Applied Physics Letters 44, 9 (1984), pp. 907-909.

M. Bäumler, et al., "Photoresponse of the $As_{Ga}$ antisite defect in as-grown GaAs," Applied Physics Letters 45, 8 (1985), pp. 781-783.

P. Silverberg, et al., "Hole photoionization cross sections of EL2 in GaAs," Applied Physics Letters 52, 20 (1988), pp. 1689-1691.

G. M. Martin, et al., "Compensation mechanisms in GaAs," Journal of Applied Physics 51, 5(1980), pp. 2840-2852.

D. E. Holmes, et al., "Stoichiometry-controlled compensation in liquid encapsulated Czochralski GaAs," Applied Physics Letters 40, 1 (1982), pp. 46-48.

J. Lagowski, et al., "Origin of the 0.82-eV electron trap in GaAs and its annihilation by shallow donors," Applied Physics Letters 40, 4 (1982) pp. 342-344.

D. T. J. Hurle, "A comprehensive thermodynamic analysis of native point defect and dopant solubilities in gallium arsenide", Journal of Applied Physics 85, 10 (1999), pp. 6957-7022.

M. Wickert, "Physikalische Mechanismen der Homogenisierung elektrischer Eigenschaften von GaAs-Substraten," Dissertation, Fakultät fur Mathematik und Physik der Albert-Ludwigs-Universität Freiburg i. Br., 1998 (with English Excerpt Translation, 5 pgs.).

J. Stenzenberger, et al., "Growth and characterization of 200 mm Si GaAs crystals grown by the VGF Method," Journal of Crystal Growth 250 (2003), pp. 57-61.

J. Nishio et al., "Theoretical analysis for the segregation in the liquid encapsulated Czochralski system", The Journal of Crystal Growth, 141(1-2), 1994, pp. 249-255.

A. Croll et al., "Floating-zone growth of GaAs", Journal of Crystal Growth, No. 166, (1996), pp. 239-244.

H. Wenzl et al., "Phase relations in GaAs crystal growth", Journal of Crystal Growth, No. 109, (1991), pp. 191-204.

Newman, R.C., The lattice locations of silicon impurities in GaAs: effects due to stoichiometry, the Fermi energy, the solubility limit and DX behaviour, Semicond. Sci. Technol., 9, 1994, pp. 1749-1762.

Korb et al., Carbon, oxygen, boron, hydrogen and nitrogen in the LEC growth of SI GaAs: a thermochemical approach, Journal of Crystal Growth 198/199, 1999, pp. 343-348.

Kitamoto et al., Optical measurement of carrier concentration profile in n-type semiconducting GaAs substrate, Phys. Stat. Sol. (a), 204(4), 2007, pp. 1002-1007.

Osamura and Murakami, Free Carrier Absorption in n-GaAs, Japanese Journal of Applied Physics, 11(3), 1972, pp. 365-371.

Kozlova et al., A comparative study of EL2 and other deep centers in undoped SI GaAs using optical absorption spectra and photoconductivity measurements, Nuclear Instruments and Methods in Physics Research A, 512, 2003, pp. 1-7.

Hagi et al., Low Dislocation Density 3-inch Si doped GaAs Crystals by Vertical Boat Growth, Semiconducting and Semi-Insulating Materials Conference, IEEE, 1996, pp. 279-282.

U. Kretzer, U.S. PTO Office Action, U.S. Appl. No. 13/672,177, dated Oct. 8, 2013, 11 pages.

U. Kretzer et al., U.S. PTO Notice of Allowance, U.S. Appl. No. 13/672,177, dated Mar. 28, 2014 10 pages.

* cited by examiner

PROCESS FOR THE MANUFACTURE OF DOPED SEMICONDUCTOR SINGLE CRYSTALS, AND III-V SEMICONDUCTOR SINGLE CRYSTAL

CROSS-REFERENCE TO RELATED PATENT APPLICATIONS

This application is a divisional application of U.S. application Ser. No. 11/478,450, filed Jun. 30, 2006, now U.S. Pat. No. 7,410,540, which claims the benefit under 35 USC 119(e) of U.S. Application Ser. No. 60/697,860, filed Jul. 8, 2005, and also claims the benefit of priority from Federal Republic of Germany Application No. 10 2005 030 853.8, filed Jul. 1, 2005, the entire contents of all of which are incorporated herein by reference.

BACKGROUND OF THE INVENTION

The present invention relates to a process for the manufacture of semiconductor single crystals that are doped with a dopant, in particular to compound semiconductor single crystals having high electrical conductivity of n-type and p-type, preferably n-type. The process comprises solidifying a melt of the semiconductor material in a crucible by using a seed crystal of the same semiconductor material as the semiconductor single crystal to be produced.

In various fields of semiconductor technology, in particular for the manufacture of semiconductor lasers, luminescence diodes and solar cells, compound semiconductor crystals or substrate wafers are required that have electrical conductivity lying within a specific range determined by the respective use. This conductivity is achieved by doping with appropriate dopants. Furthermore, by choosing the dopant, it can be determined whether the charge transport within the semiconductor is dominated by electrons or defect electrons. The value of the electrical conductivity is determined by the concentration of the dopant in the semiconductor single crystal.

A common process for the manufacture of semiconductor single crystals, and specifically of compound semiconductor single crystals, includes the step of solidifying the semiconductor melt in a crucible, which is formed, e.g., of boron nitride. The semiconductor melt may be covered by a cover melt, which is, e.g., formed of boron oxide ($B_2O_3$), in order to avoid an evaporation of volatile components of the semiconductor melt. The crucible normally is a cylindrical container, which conically tapers toward its lower end in its operating orientation, and extends to a cylindrical portion having a lower diameter at the lower end which may be closed at its bottom side. The lower cylindrical portion serves for receiving a seed crystal. By means of heating elements provided outside the crucible, a three-dimensional, preferably radially symmetric, temperature field is applied, wherein the symmetry axis essentially corresponds to the symmetry axis of the crucible. The temperature field is formed such that, at each location within the crucible, a temperature gradient having a vertical component is present. During the crystal growth process, the temperature field is changed such that the solidification/temperature-isotherm shifts in a vertical direction, starting from the seed crystal. There is a good controllability of the crystal growth process, if the solidification front, i.e., the phase interface between the crystal and the semiconductor melt, differs only slightly from the solidification/temperature-isotherm over the whole cross section of the crucible and at each point in time of the process.

In the conventional manufacturing processes for semiconductor single crystals, and specifically compound semiconductor single crystals, doping is carried out by adding the dopant, in elementary or chemically bound form, to the crucible before or after melting the semiconductor material, and subsequently carrying out the process of single crystal growth by solidification of the melted semiconductor material. In a specific work of Formari et al. (*Journal of Crystal Growth* 63 (1983), 415-418) pertaining to Si-doped GaAs single crystal based on the LEC process, essentially the whole amount of the dopant silicon, which corresponded to the desired dopant concentration, was correspondingly pre-charged into the melt ($2.5 \times 10^{19}$ atoms/cm$^3$), after which a small amount of silicon was further added to the melt during the subsequent crystal growth, for gradually reaching a maximum concentration of $3 \times 10^{19}$ atoms/cm$^3$ in the melt. Formari et al. tried to solve the problem of generating solid particles in the melt, which may flow on top of the GaAs melt and thus, specifically in the LEC process where the crystal is pulled out of the melt, may disturb the single crystal growth by a contact of the particles with the phase interface between crystal and melt. This phenomenon however does not pose a problem in VGF-processes, because the phase interface between crystal and melt does not have a contact to the upper melt surface.

In conventional processes, the amount of the pre-charged dopant is determined such that a dopant concentration is adjusted in the melt. Considering the effective distribution coefficient, this leads to an incorporation of the dopant into the single crystal at the desired concentration. For achieving a high conductivity, a high amount of dopant is added into the melt.

When using a covering melt, e.g., with a boron oxide melt, the semiconductor melt is directly in contact with this melt during the whole period of the crystal growth process. Depending on the affinity of the chosen dopant in relation to oxygen, an oxidation of the dopant and a dissolution of the oxide in the boron oxide melt occurs partially. As a result, a part of the dopant is removed from the semiconductor melt. At the same time, the impurity generated by the reaction (in the example here: boron) is incorporated into the semiconductor melt. The prepared crystals may thus be contaminated by this impurity (e.g., boron) at a substantial concentration, thereby impairing the quality. For example, an impurity with boron may lead to formation of electrically compensating defects and thus to a decrease of the electrical conductivity.

In [1] JP 2000-109400A, [2] JP 2004-217508A and [3] JP 10-279398A, processes are described according to which a homogenization of silicon inclusion into a gallium arsenide single crystal is to be achieved. The axial homogeneity of the electrical conductivity of the single crystal is said to be improved thereby. The processes are based on stirring a boron oxide cover melt at a certain point of time, or at several points of time during the crystal growth process. In the processes described in [2] and [3], a $SiO_2$-enriched boron oxide cover melt is used in order to suppress oxidation of the silicon dopant contained in the gallium arsenide melt. For the reaction equilibrium between silicon, boron oxide and $SiO_2$, the concentration of boron oxide at the phase borderline to the gallium arsenide melt is significant. Stirring the boron oxide cover melt leads to its thorough mixing and thus to a decrease in the $SiO_2$-concentration at the interface to the gallium arsenide melt. In this way, the oxidation of silicon contained in the gallium arsenide melt is enhanced, and the silicon concentration in a gallium arsenide single crystal increases less at its end than without this measure. However, by oxidizing silicon with boron oxide, the concentration of the boron impurity in the gallium arsenide melt and in the gallium arsenide single crystal is increased.

The processes described in [1], [2] and [3] enable a certain homogenization of silicon inclusion into a gallium arsenide single crystal, but the concentration of boron impurity in the gallium arsenide melt and in the gallium arsenide single crystal is increased. This disadvantageously affects the quality of the generated crystals. In the manufacture of a gallium arsenide single crystal according to a process described in JP 2004-115339A [4], the gallium arsenide melt is separated from the boron oxide cover melt by an isolating layer of liquid boron arsenide. The oxidation of the dopant silicon is diminished thereby.

US 2004/0187768 A1 follows another concept for the manufacture of doped GaAs crystals of p-type that have a very low dislocation density of <100 cm$^{-2}$. The low dislocation density is obtained by mandatorily adding 4 types of dopants to the GaAs starting material, namely, Zn as a p-type dopant, Si as an n-type dopant, B as a neutral atom, and In as a neutral atom. That is, a high p-type conductivity is obtained by doping with zinc, while the other dopants, Si, B and In, lead to an impurity hardening effect. The necessity of purposively doping 4 types of dopants limits the applicability of such wafer materials.

U.S. Pat. No. 3,496,118 describes a process for increasing electrical conductivity of III-V semiconductor compounds. A melt of the III-V semiconductor compound is produced in the presence of an impurity selected from Al, Sb, Bi, In and Pb, and a crystal is formed at a solidification point which is intentionally lowered by the added impurity. As conductivity generating impurities, doping atoms are added that are selected from Mn, Te, Se, S, Cd, Zn, Sn, Ge and Si. The amount of impurity being added is so high that a III-V-multiple component melt and thus a corresponding crystal (ternary, quaternary) is produced, rather than dealing with doping or formation of a binary III-V single crystal.

In order to satisfy the need for III-V semiconductor single crystals having a desirably high charge carrier mobility of the dopant, the conventional manufacture normally is carried out without a cover melt of, e.g., $B_2O_3$, in a boat for horizontal solidification of the semiconductor melt. However, this manufacturing principle is applicable only to the manufacture of III-V semiconductor crystals having small diameters, such as, normally 2 inches (1 inch=2.54 cm) or up to maximally 3 inches. For example, the abstract of KR 1019920010134 B1 describes a Bridgman process in which the solidification of the GaAs melt is carried out in a sealed quartz ampoule, without a boron oxide cover melt. A GaAs single crystal produced by this process has a electron mobility of 2,000 to 4,000 cm/Vs and an electron concentration of $10^{17}$-$10^{18}$ cm$^{-3}$ To produce III-V semiconductor crystals having larger diameters, particularly diameters of at least 100 mm, the process of vertically directed solidification of a melt of the semiconductor material conventionally required use of a cover melt of, e.g., boron oxide. However, this leads to the problems described above.

The conventional processes are not successful for manufacturing semiconductor single crystals that have a high electrical conductivity, while at the same time providing a high process security, yield and quality.

SUMMARY OF THE INVENTION

It is one object of the invention to provide an improved process for manufacturing doped semiconductor single crystals.

A particular object of the invention is to provide an improved process for manufacturing doped semiconductor crystals of III-V semiconductor compounds, which have a high electrical conductivity while concurrently having a low level of impurity, e.g., an impurity such as boron derived from a cover melt.

Another object resides in providing such a process in which the product quality, the process security and the yield are enhanced at the same time, thereby improving the economy of the process.

In accomplishing one or more of these objections, there has been provided in accordance with one aspect of the invention a process for manufacturing a semiconductor single crystal doped by a dopant, comprising: solidifying a melt of semiconductor material using a seed crystal of the same semiconductor material as the semiconductor single crystal to be manufactured, in a crucible comprising a tapered portion and a cylindrical portion; and adding a pre-determined amount of dopant to the semiconductor material prior to formation of the single crystal, to adjust a desired electrical conductivity in the semiconductor single crystal, wherein at least a portion of the pre-determined amount of dopant is added to the semiconductor melt after growth of semiconductor single crystal onto the seed crystal has started, or after at least partial solidification has occurred of semiconductor single crystal in the tapered portion of the crucible.

In accordance with another aspect of the present invention, there is provided a III-V semiconductor single crystal comprising: a concentration of an electrical conductivity-generating dopant of at least about $1 \times 10^{18}$ atoms/cm$^3$, and a concentration of an impurity, which is present due to the manufacturing process for the single crystal, of at most about $5 \times 10^{18}$ atoms/cm$^3$, wherein the III-V semiconductor single crystal has an electrical conductivity of at least about 250 Siemens/cm, and/or a specific resistivity of at most about $4 \times 10^{-3}$ $\Omega$cm.

In accordance with another aspect of the present invention, there is provided a III-V semiconductor single crystal having a diameter of at least about 100 mm and comprising: a concentration of an electrical conductivity-generating dopant of at least about $1.0 \times 10^{18}$ atoms/cm$^3$ and a charge carrier concentration of at least about $1.0 \times 10^{18}$ cm$^{-3}$, wherein the hall mobility, determined according to ASTM F76-86, for the case of a charge carrier concentration of 1.0 to $1.2 \times 10^{18}$ cm$^{-3}$ is higher than 2,100 cm$^2$/Vs, and for the case of a charge carrier concentration of higher than $1.2 \times 10^{18}$ cm$^{-3}$, is higher than 1,900 cm$^2$/Vs.

According to still another aspect of the invention there is provided a substrate wafer made from the III-V semiconductor single crystal materials described above.

Further objects, features and advantages of the present invention will become apparent from the detailed description of preferred embodiments that follows, when considered together with the accompanying figures of drawing.

DETAILED DESCRIPTION OF THE PREFERRED EMBODIMENTS

One disadvantage of conventional processes for manufacturing semiconductor single crystals, in particular those for the manufacture of III-V compound semiconductor single crystals having high electrical conductivity, such as e.g., the processes described in [1] to [4] or similar processes, is believed to reside in the presence of dopants such as silicon, and thus in an associated increase in sub-cooling or super-cooling of the melt. If the concentration of the dopant in the melt reaches a certain range, essential physical parameters of the melt are influenced such that they unfavorably affect the controllability of critical process stages of the crystal growth process. This may result in substantial, more or less arbitrary deviations between the solidification/temperature-isotherm and the phase interface, whereupon the controllability of the crystal growth process is significantly deteriorated. Such deviations represent a particular risk in the process of starting crystal growth at the seed crystal, and in the process of solidification in the conical or tapered portion of the crucible. Defect seed formations or twin growth in these parts of the crystal growth process extend into the further growing crystal. In addition, a substantial loss of crystal length to be utilized may occur, which negatively affects the yield and thus the economy of the crystal growth process. Moreover, the addition of dopant correlates with the incorporation of impurity when using a cover melt. The higher the desired concentration of dopant chosen, the higher the risk of incorporating the impurity. In the conventionally manufactured semiconductor single crystals, and the substrate wafers produced therefrom, it was therefore not possible to combine a high dopant concentration such as, e.g., silicon, and the properties of a relatively high electrical conductivity and/or a relatively low electric resistivity resulting therefrom, with a relatively decreased concentration of impurity such as, e.g., of boron.

A sub-cooling or supercooling of the melt during growth in the crystal conus can be determined by the measurement of the facet length on the crystal. At a high-dopant concentration, an asymmetric formation of the facets may occur in compound semiconductors, i.e., the sub-cooling depends on the nature of the facet-like growth faces. In high silicon doped gallium arsenide single crystals, this asymmetry of the facet length Ga/As may amount to a ratio of 2:1, due to the sub-cooling of the melt. In this case, the sub-cooling amounts to several degrees Kelvin.

The process according to the invention has the advantage that the sub-cooling or supercooling of the semiconductor melt is significantly reduced in the critical process periods when crystal growth starts at the seed crystal, as well as during the solidification in the conical or tapered portion of the crucible. Thus, the controllability of the crystal growth process in these process periods is improved, and the probability of generating defects of the single crystal growth is significantly reduced. A further advantage resides in the shortness of the time period during which dopant might be oxidized by oxygen contained in the cover melt, such as boron oxide. Thus, the loss of dopant, and the incorporation into the semiconductor melt of impurity from the cover melt, such as boron, are decreased. Based upon a given predetermined dopant concentration, the produced crystals contain a significantly lower concentration of impurities, such as boron, which derives from the cover material. By means of the process according to the invention, the process security and the yield, and thus the economy of the process, as well as the quality and the properties of the single crystals are significantly improved.

As a result, the prepared semiconductor single crystal grown in the cylindrical portion of the solidified ingot, which is utilized later for preparing a semiconductor wafer, has a desired and predeterminable electrical conductivity due to the controlled addition of dopant at a concurrently lower incorporation of undesirable impurities. In comparison with the prior art, the process according to the invention provides a significantly improved relation of high doping (corresponding to a higher conductivity) to low impurity for each solidified ratio of the ingot, i.e., the ingot volume portion for the subsequent preparation of the substrate wafer. This is due to reduced problems and defects by the invention.

Thereby, in a particular aspect of the invention, a III-V semiconductor single crystal can be provided which has a unique combination of electrical conductivity and electric resistivity, while containing a sufficient amount of conductivity-producing dopant such as Si, but at the same time limiting the amount of impurity which is present as a result of the manufacturing process. Hence, the III-V semiconductor single crystal comprises:

a concentration of an electrical conductivity-generating dopant of at least $1 \times 10^{18}$ atoms/cm$^3$, and a concentration of an impurity, which is present due to the manufacturing process, of at most $5 \times 10^{18}$ atoms/cm$^3$, wherein the III-V semiconductor single crystal has an electrical conductivity of at least 250 Siemens/cm, and/or a specific resistivity of at most $4 \times 10^{-3}$ Ωcm. Here, the expression "impurity which is present due to the manufacturing process" means that this impurity type is not added into crucible as a dopant to be intentionally mixed with the III-V semiconductor starting material, for example, for adjusting the conductivity or for influencing a dislocation density. Rather, this term means that the impurity is unavoidably included due to the type of manufacturing process used to produce the III-V semiconductor single crystal, such as, boron from the boron oxide cover melt that is necessary for manufacturing large wafers of at least 100 mm diameter that have good properties. This aspect of the invention is therefore particularly useful for the provision of III-V semiconductor single crystals having a diameter of at least 100 mm, in particular those of the n-type.

Further, due to the significantly improved relation of high doping (correspondingly high conductivity) to low impurity that can be achieved in III-V semiconductor single crystals of relatively large diameters, even as large as at least 100 mm, and the wafers correspondingly produced therefrom, the present invention, surprisingly permits realization of high mobilities of the charge carrier concentration (determined by the hall mobility measurable according to the standard F76-86).

Thus, it is possible to provide, according to another aspect of the invention, a III-V semiconductor single crystal having a diameter of at least 100 mm and comprising:
a concentration of an electrical conductivity-generating dopant of at least $1.0\times10^{18}$ atoms/cm$^3$ and
a charge carrier concentration of at least $1.0\times10^{18}$ cm$^{-1}$,
wherein the hall mobility, determined according to ASTM F76-86, for the case of a charge carrier concentration of 1.0 to $1.2\times10^{18}$ cm$^{-3}$ is higher than 2,100 cm$^2$/Vs, and for the case of a charge carrier concentration of higher than $1.2\times10^{18}$ cm$^{-3}$, in particular in the range up to $2.0\times10^{18}$ cm$^{-3}$, the hall mobility is higher than 1,900 cm$^2$/Vs.

By controlling the dopant used for adjusting the electrical conductivity and by minimizing other impurities that are present due to the manufacturing process, an excellent crystal quality of binary III-V single crystals is obtained by the invention. These crystals additionally have a unique combination of conductivity, charge carrier concentration and charge carrier (hall) mobility.

In the manufacturing process according to the present invention, the amount of dopant which is chosen for the adjustment of the desired, predetermined electrical conductivity need not to be completely added under either condition (a) or condition (b) indicated above, but the addition of the total amount of the dopant can alternatively be carried out in at least two steps, among which only one step meets the condition (a) or (b). That is, it is possible to add a lower amount of dopant, which is still tolerated for the avoidance of substantial disadvantages, in advance or provisionally into the crucible, i.e., before starting with the solidification of the semiconductor melt. When working according to a conventional process, the pre-determined concentration of the dopant must not be exceeded in advance of the crystal-formation or crystal-growth process, or there will result disadvantages such as defects of the single crystal growth. The practical limit on the amount of dopant that can be added in advance of the crystal formation is represented by an amount which does not exceed the amount at which single crystal formation occurs substantially without defects. Typically, this is an amount less than the amount which causes substantial sub-cooling or super-cooling of the melt. Typically, up to about ⅔, and preferably between ⅕ and ½, of the total dopant amount to be added can be added in advance of crystal formation onto the seed crystal. For example, in the manufacture of silicon doped gallium arsenide single crystals, the maximum starting silicon concentration in the gallium arsenide melt, which is still tolerable for the avoidance of substantial disadvantages, is, e.g., about $4\times10^{18}$ atoms/cm$^3$ (corresponding to $5.6\times10^{17}$ atoms/cm$^3$ in the solidified crystal). In the embodiment of step-wise addition of dopant according to the invention, the critical period of the seed crystal growth, as well as of the crystal formation in the conical or tapered portion, is enabled under controlled conditions at low or uncritical dopant concentration in the first step, e.g., maximally at about $4\times10^{18}$ atoms/cm$^3$ in the melt (corresponding to $5.6\times10^{17}$ atoms/cm$^3$ in the solidified crystal). On the other hand, in the second step for crystallization in the cylindrical main portion of the crucible, i.e., the portion that is later utilized for the substrate wafer preparation, a higher pre-determined dopant concentration is chosen, as desired, e.g., at least about $4\times10^{18}$ atoms/cm$^3$ in the melt (corresponding to $5.6\times10^{17}$ atoms/cm$^3$ in the solidified crystal). Optionally or preferably, a concentration above this level may be used. Suitable pre-adjustments of the dopant concentration for the first step are possible; however, the principle of this embodiment is not limited thereto, as this represents merely one preferred embodiment. For example, a dopant addition in the first step may be chosen such that a dopant concentration in the conical or tapered portion increases toward the cylindrical portion of the crucible, and/or such that a continuous transition of the dopant concentration from the conical portion to the cylindrical portion is obtained.

Depending on the process options described above, the concentration of impurity deriving from the cover melt is below about $5\times10^{18}$ atoms/cm$^3$ within the cylindrical portion of the semiconductor single crystal.

The use of a cover melt according to certain embodiments avoids evaporation of volatile components from the semiconductor melt, and at the same time enables an economic working manner. Suitable preferred materials for the cover melt are boron oxide, boron arsenide and silica, as well as one or more combinations thereof. One particularly preferred material for covering a III-V semiconductor melt is boron oxide. It is possible with the present invention to substantially limit the impurity deriving from the cover melt, e.g., boron, even if a high dopant concentration is desired.

The merit of the invention is particularly significant in the manufacture of compound semiconductor single crystals, and of substrate wafers optionally prepared therefrom. The single crystals manufactured according to the invention comprise, as main components, preferably III-V semiconductor compounds, such as, GaAs, InP, GaP, InAs, GaSb, InSb or other semiconductor compounds, such as, SiGe, HgCdTe, HgZnTe, ZnO, or alternatively they consist essentially of the mentioned III-V semiconductor compounds. A particularly preferred semiconductor single crystal material is GaAs.

The dopant chosen primarily for the adjustment of the electrical conductivity is suitably added in solid form. A dopant which is particularly suitable for the generation of a high conductivity, in the example of GaAs, is silicon (Si); however, tellurium (Te), sulphur (S), zinc (Zn) and selenium (Se) can also be used, alone or in combination, and, respectively, in elementary or chemically-bound form. The provision of III-V semiconductor single crystals of n-type is particularly preferred, and Si is a preferred dopant. Since compensating boron defects are important in n-type semiconductors or in combination with a Si dopant, a boron concentration is to be minimized according to the process of the invention as far as possible, and is to be limited to traces that are unavoidable due to the manufacturing process. Indium (In) can be omitted as a dopant. Further, dopant needs to be added only in the amount that is predetermined to adjust a desired electrical conductivity. By these measures, it is possible to produce binary III-V semiconductor single crystals and, in particular, binary GaAs single crystal.

The process according to the invention can be applied to all processes for the manufacture of doped semiconductor single crystals made from a semiconductor melt. As is apparent from the above description, the effects according to the invention may be exerted, in particular, when an oriented solidification from the bottom to the top is carried out directly in the melt. Therefore, the process according to the invention is particularly well applied to the technique of VGF (Vertical Gradient Freeze) or the VB (Vertical Boat or Vertical Bridgman) process. By its use, extremely low dislocation densities in the prepared III-V semiconductor single crystal or substrate can be obtained, preferably a dislocation density in the range of at most 5×102 cm-2.

Thus, with the technique according to the invention, III-V semiconductor single crystals can be realized, as these are defined above and as exemplified in the preferred embodiments hereinafter described.

The substrate wafer defined above can be formed starting from the III-V semiconductor single crystal according to the invention, e.g., by sawing or another separation technique of the single crystal ingot. The respective substrate wafer mirrors or represents the conditions with respect to dopant concentration, impurity concentration, specific electrical conductivity and electric resistivity, which conditions correspond to the respective solidified ratio (g) in the axial direction of the crystal.

According to the invention, it is possible and also preferred that the following conditions are satisfied in the whole cylindrical portion of the III-V semiconductor single crystal, i.e., over the whole solidified ratio (g) of the cylindrical crystal ingot, and that these conditions are correspondingly present in all substrate wafers which are prepared from this III-V semiconductor single crystal or ingot.

a concentration of an electrical conductivity-generating dopant of at least about $1 \times 10^{18}$ atoms/cm$^3$, and a concentration of an impurity, which is present due to the manufacturing process for the single crystal, of at most about $5 \times 10^{18}$ atoms/cm$^3$, wherein the III-V semiconductor single crystal has an electrical conductivity of at least about 250 Siemens/cm, and/or a specific resistivity of at most about $4 \times 10^{-3}$ $\Omega$cm; or a concentration of an electrical conductivity-generating dopant of at least about $1.0 \times 10^{18}$ atoms/cm$^3$ and a charge carrier concentration of at least about $1.0 \times 10^{18}$ cm$^{-3}$, wherein the hall mobility, determined according to ASTM F76-86, for the case of a charge carrier concentration of 1.0 to $1.2 \times 10^{18}$ cm$^{-3}$ is higher than 2,100 cm$^2$/Vs, and for the case of a charge carrier concentration of higher than $1.2 \times 10^{18}$ cm$^{-3}$ is higher than 1,900 cm$^2$/Vs.

The inventive concept is applicable in a particularly advantageous manner to larger single crystal and substrate wafer diameters of at least 100 mm, preferably those of at least 150 mm, and those of at least 200 mm, i.e., diameters for which the process of the invention especially advantageously leads to the unique combination of electrical conductivity and electric resistivity combined with the concurrent adjustment of the charge carrier concentration and charge carrier mobility of the invention. According to the invention, for such large diameters the VGF process or the VB process is used for the crystal preparation, and a cover melt of, e.g., boron oxide is used.

Figure 1:
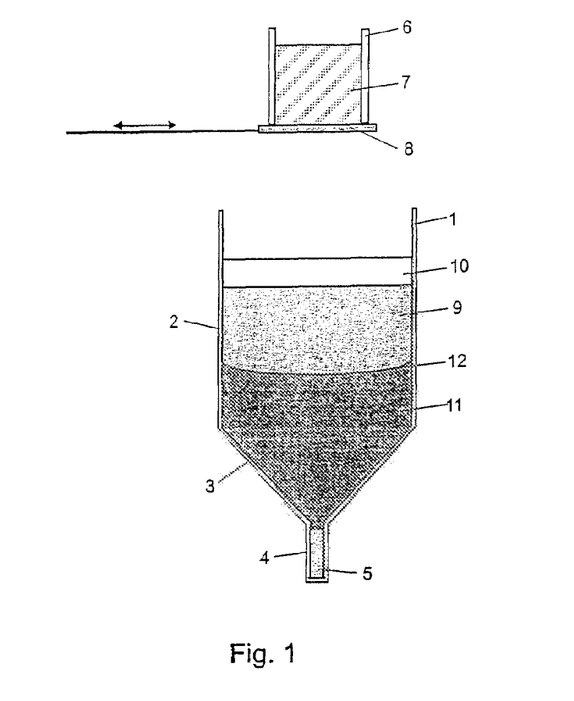
FIG. 1 is a schematic cross sectional view taken through a device for growing compound semiconductor single crystals.

As can be gathered from FIG. 1, the device for the growth of compound semiconductor single crystals comprises a crucible 1, which is formed of, e.g., boron nitride, and in particular of pBN. The crucible comprises a cylindrical portion 2, a portion 3, which in the operating orientation is conically tapered at its lower end, and, extending therefrom, a lower cylindrical portion 4 having a smaller diameter, which may be closed at its bottom side. The lower cylindrical portion 4 serves for receiving a seed crystal 5.

The crucible 1 is placed in a furnace, not shown in FIG. 1, in a known manner. The furnace conventionally comprises heating elements for the generation of a three-dimensional temperature field having a vertical temperature gradient. A control is provided for operating the heating elements in a manner so that the solid semiconductor material charged into the crucible 1 is melted, and so that the semiconductor melt, starting at the seed crystal 5, continuously solidifies toward the upper side of the crucible 1. Above the crucible, a container 6 is provided that contains a predetermined amount of dopant 7. The container may be opened by means of a device 8 at its lower side, so that the dopant 7 contained therein falls into the crucible 1.

In the process according to the invention, first a seed crystal 5, which is composed of the same semiconductor material as the crystal to be produced, is charged into the cylindrical portion 4 of the crucible 1. The semiconductor material, for example, GaAs or another preferred III-V semiconductor compound, as well as the material for the cover melt, for example, boron oxide, are then filled into the crucible 1 in solid form, respectively. The semiconductor material charged into the crucible 1 may already comprise a low amount of dopant in the form of a doping material added during the preparation of this semiconductor raw material. Alternatively, or in addition, a dopant material may be added into the crucible 1 in such a low amount that the dopant concentration, which is adjusted in the semiconductor melt, yet does not lead to a significant enhancement of the constitutional ratio in the supercooling of the semiconductor melt. A predetermined amount of dopant 7 in solid form is added to container 6, which is closed at its lower side by means of device 8. The heating elements are controlled such that the semiconductor material and the cover material (boron oxide) are completely melted. Due to the density difference, the semiconductor melt is located in the lower part of the crucible and is completely covered by the cover melt 10 (boron oxide). The heating elements are then controlled so that a vertical temperature gradient is formed and so that the semiconductor melt, starting at the seed crystal and extending upwardly, solidifies and forms a semiconductor single crystal 11.

At a point in time that is generally not before the seeding or not before the initial period of growth of the semiconductor single crystal that solidifies from the semiconductor melt is finished, or that is preferably not before the solidification front 12 essentially or completely reaches the transition region between the conical portion 3 and the cylindrical portion 2 of the crucible 1, the container 6 is opened by means of the device 8 at its lower side to permit the dopant 7 to fall into the crucible and to be solubilised in the semiconductor melt 9. The dopant 7 is added in a suitable solid form, which enables it to pass the cover melt substantially and preferably completely in the added amount, and allows it to enter the semiconductor melt 9. The amount of dopant added in this manner is determined such that a dopant concentration in the melt is adjusted to a level that leads to an incorporation of the dopant into the single crystal in the desired concentration, taking into consideration the effective distribution coefficient. Thereby, the desired dopant concentration in the prepared semiconductor single crystal and thus in the later produced substrate wafer can be adjusted. When determining the dopant amount, the concentration of the dopant that is already present in the semiconductor melt and the level of the already solidified ratio of the semiconductor melt are considered. The solidification process may be paused by suitably controlling the heating elements for a time period that is appropriate to permit dissolution of the dopant in the semiconductor melt and homogenization thereof. Subsequently, the crystal growth is continued until the semiconductor melt completely solidifies.

The addition of the dopant after the growth of the single crystal onto the seed crystal has started, or preferably after solidification in the conical or tapered portion of the crucible is (essentially and, preferably, completely) completed avoids a substantial supercooling of the semiconductor melt during the period of crystal growth start at the seed crystal, as well as during the period of solidification in the conical portion of the crucible. This avoids the probability that defect formations and twin growth occur in these critical periods of the crystal growth process. The time period that is available for oxidation of the dopant by the cover melt (e.g., boron oxide melt) is also shortened. Thus, even at a high dopant concentration, a significant decrease in impurity level of the crystals by the impurity (e.g. boron) derived from the cover melt is achieved. In addition, improved crystallographic properties are ensured, in particular the presence of a single crystallographic orientation without any defect orientation or twin crystal formation. Moreover, the hall mobility is favorably influenced. In comparison with semiconductor single crystals produced by conventional processes, the concentration of undesirable defect locations, such as boron defect sides, can be decreased.

Figure 2:
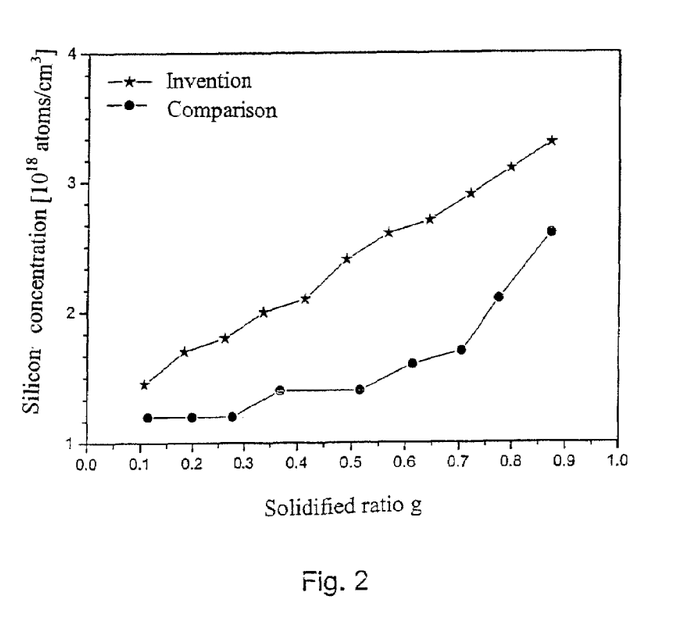
FIG. 2 is a graph of an exemplary silicon doped gallium arsenide single crystal, showing the axial distribution of the silicon concentration in a single crystal prepared according to the invention, in comparison with a single crystal prepared according to a conventional process.

In FIG. 2, the axial distribution of the silicon concentration, measured by means of ICP-AES (inductively coupled plasma atomic emission spectrometry), is illustrated for the example of a silicon doped gallium arsenide single crystal produced by the process according to the invention. A comparison with the axial distribution of the silicon concentration in a gallium arsenide single crystal produced according to a conventional process shows that the basic dependency of the silicon concentration upon the axial position within the crystal, expressed by the solidified ratio (g), is generally the same in both processes. However, the silicon concentration in the crystal produced by the process according to the invention, at each axial position of the crystal, is 2.5-fold in comparison with a concentration in a crystal produced according to the conventional process, without decreasing single crystal yield. The first measurement point at the left side in FIG. 2 (and correspondingly in the following FIGS. 3-6) refers to the beginning of the cylindrical portion.

Figure 3:
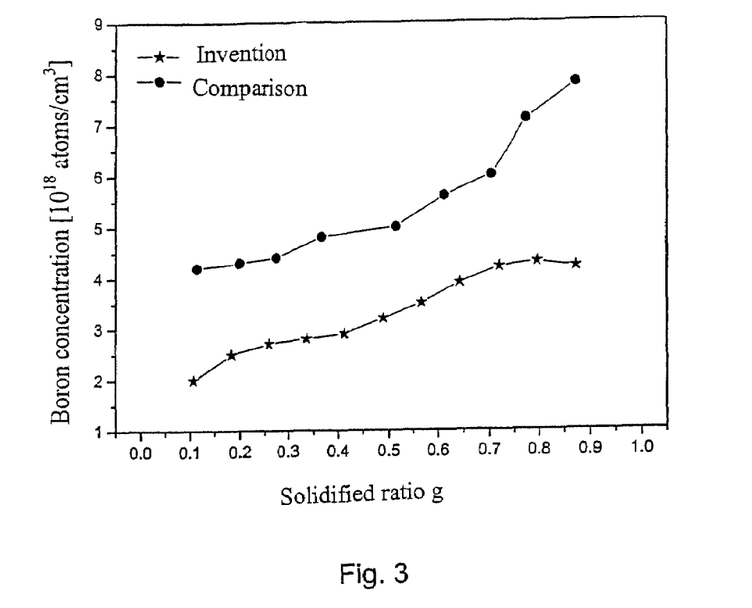
FIG. 3 is a graph showing the axial distribution of the boron concentration in the same silicon doped gallium arsenide single crystal shown in FIG. 2, on the one hand according to the invention and on the other hand according to the comparison example.

FIG. 3 shows a corresponding comparison of the concentration of the boron impurity. This concentration can be decreased by a factor of 2-3 by means of the process according to the invention.

Figure 4:
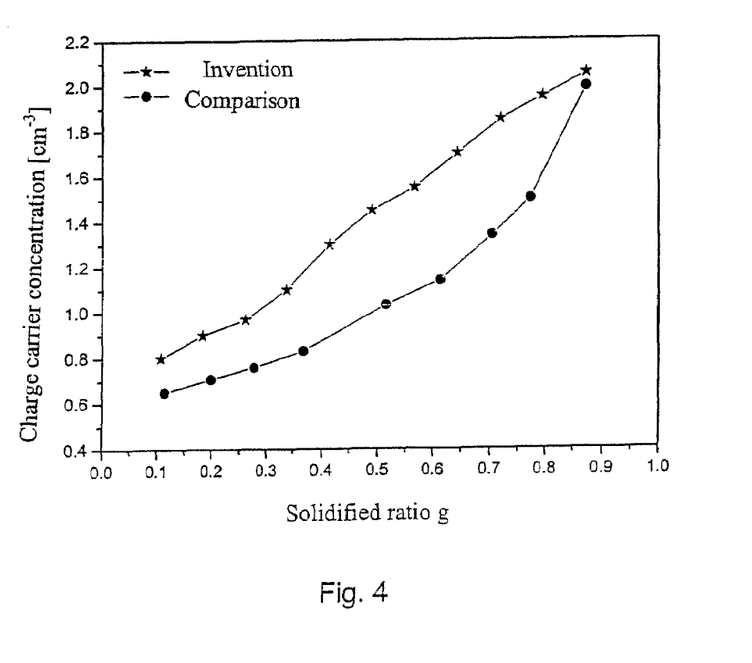
FIG. 4 is a graph showing a corresponding comparison of the axial distribution of the charge carrier concentration, respectively referring to the example according to the invention and to the comparative example of FIG. 2.

FIG. 4 shows a corresponding comparison of the axial distribution of the charge carrier concentration. The charge carrier concentration can be increased in the whole portion of the crystal that is used for the manufacture of substrate wafers, by using the process according to the invention.

Figure 5:
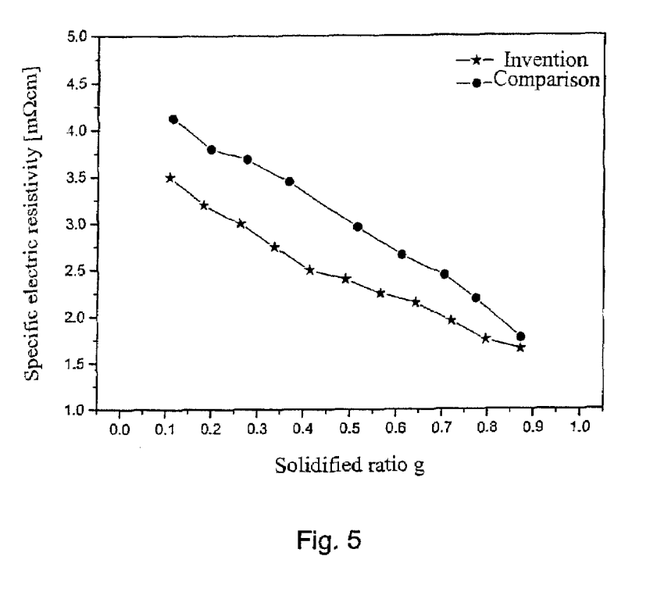
FIG. 5 is a graph showing a corresponding comparison of the axial distribution of the electric resistivity, respectively of the example according to the invention and to the comparative example of FIG. 2.
Figure 6:
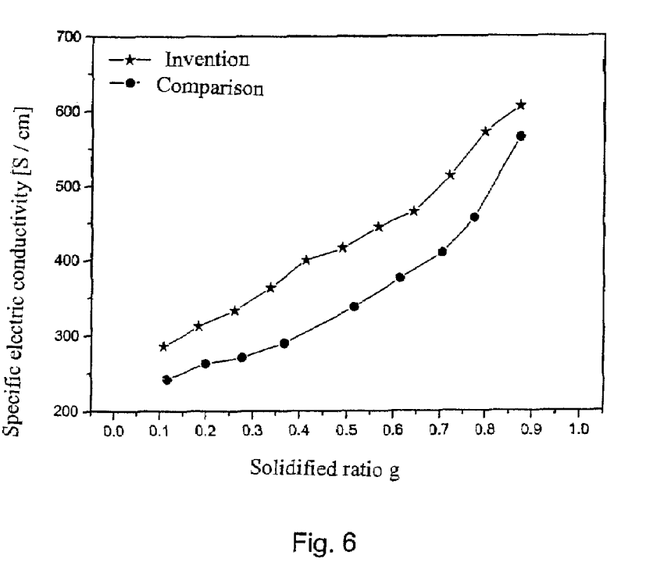
FIG. 6 is a graph showing a corresponding comparison of the axial distribution of the specific electrical conductivity, respectively with respect to the example according to the invention and to the comparison example of FIG. 2.

FIG. 5 and FIG. 6 show that, compared to the conventionally produced semiconductor single crystal, only in the semiconductor single crystal according to the invention is there combined a relatively low electric resistivity and a relatively high specific electrical conductivity, with reference to each respective solidification point in the crystal. The electric resistivity and the specific electrical conductivity can be determined according to the method of van der Pauw (ASTM F76-86, "Standard Test Methods for Measuring Resistivity and Hall Coefficient and Determining Hall Mobility in Single-Crystal Semiconductors").

Figure 7:
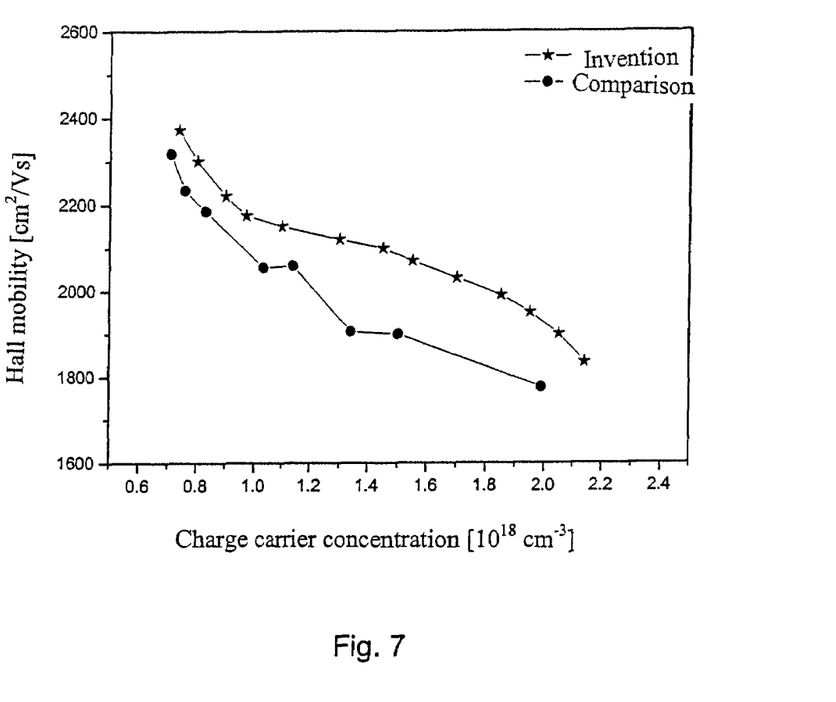
FIG. 7 is a graph showing a comparison of the experimentally determined dependency between the hall mobility and the charge carrier concentration, comparing a single crystal prepared according to the invention and a single crystal prepared according to a conventional process.

In FIG. 7, the dependency of the hall mobility is plotted against the charge carrier concentration, determined by hall measurements according to ASTM F76-86 "Standard Test Methods for Measuring Resistivity and Hall Coefficient and Determining Hall Mobility in Single-Crystal Semiconductors." Data is given for the example of a silicon doped gallium arsenide single crystal having a relatively high diameter (here: 100 mm) produced by the process according to the invention and also by a conventional process for comparison. By reducing the boron impurity, the concentration of ionic defect sites within the crystal is reduced. Since ionic defect sites function as scattering centers for charge carriers, their decrease enhances the charge carrier mobility.

The results demonstrate that, according to the invention and contrary to the conventional process, improvements in hall mobility can be achieved in the manufacture of a III-V semiconductor single crystal having a diameter of at least 100 mm, by means of a vertically directed solidification of a melt of a semiconductor material in contact with a cover melt containing, e.g., boron oxide. By means of the technique according to the present invention, the hall mobility is at least 1,900 cm2/Vs in a charge carrier concentration range of at least $1.0 \times 10^{18}$ cm$^{-3}$ and, in particular, in the range of the charge carrier concentration of $1.0 \times 10^{18}$ cm$^{-3}$ to $2.0 \times 10^{18}$ cm$^{-3}$, which is achievable according to the invention by a concentration of a conductivity-generating dopant of at least $1 \times 10^{18}$ atoms/cm$^3$. Even better, for the case of a charge carrier concentration of 1.0 to $1.2 \times 10^{18}$ cm$^{-3}$, the hall mobility is higher than 2,100 cm$^2$/Vs, and for the case of a charge carrier concentration of more than $1.2 \times 10^{18}$ cm$^{-3}$, and in particular up to $2.0 \times 10^{18}$ cm$^{-3}$, the hall mobility is higher than 1,900 cm$^2$/Vs. In a range of the charge carrier concentration of 1.3 to $1.8 \times 10^{18}$ cm$^{-3}$, the hall mobility is at least 2,000 cm$^2$/Vs.

The invention will be explained in more detail by means of an example.

For a comparison between the conventional and the inventive process, two crucibles of pyrolytic boron nitride (pBN) having a form as schematically shown in FIG. 1 (inner diameter approximately 102 mm, total length approximately 230 mm) are respectively charged with a bulk mass of undoped gallium arsenide of 11 kg. For the formation of a cover melt, a cylindrical boron oxide mass of 650 g is respectively added to each crucible. In the first crucible, 3.18 g silicon is added as a dopant. This amount is determined such that, after melting and carrying out the solidification of the melt, a silicon concentration of about $2 \times 10^{18}$ cm$^{-3}$ is adjusted at the transition between the conical and the cylindrical portions of the gallium arsenide single crystal. In the second crucible, only 0.95 g silicon, i.e., about 30% of the comparative amount is added. The first crucible is heated in a furnace until the initially solid gallium arsenide and the boron oxide is melted. By suitably controlling of the heating elements of the furnace, a vertical temperature gradient is generated. By shifting of the temperature field parallel to the longitudinal axis of the crucible, the melt, starting at the seed crystal, is completely solidified. The second crucible is also heated in a furnace, which however is equipped with a container 6 and a device 8 for a later addition of dopant into a crucible according to FIG. 1, after gallium arsenide and boron oxide are melted. In advance, an amount of 1.95 g silicon is added in solid form into the container 6. Subsequently, the solidification of the melt is carried out until the solidification front reaches the region of the transition between the conical and the cylindrical portions of the crucible. Subsequently, the container 6 is opened by means of the device 8, whereupon the silicon falls into the crucible. Subsequently, the solidification of the melt is continued.

The cylindrical portions of each crystal are prepared into wafers of about 100 mm diameter, respectively. Among the crystals produced according to the conventional process, nine comparative wafers, and among the crystal produced by the process according to the invention, eleven inventive wafers are chosen, respectively distributed over various solidified ratios g of the crystal ingot. In these wafers, the electric resistivity, the hall mobility and the charge carrier concentration are determined by means of van-der-Pauw- and hall-measurements according to ASTM F76-86 "Standard Test Methods for Measuring Resistivity and Hall Coefficient and Determining Hall Mobility in Single-Crystal Semiconductors", and the contents of silicon and boron are determined by ICP-AES. The settings in the experimental hall measurement according to ASTM F76-86 are as follows:

sample form: square plate derived from the wafer centre;
        lateral dimensions:

17 mm×17 mm; thickness 625 μm, corresponding to the wafer thickness
    sample temperature during the measurement: (22±0.2)° C.
    flux density of the magnetic field: 0.47 T
    sample current: 100 mA.

The obtained measurement data are illustrated in FIGS. 2-7. The axial position of the examined wafer is given by the ratio g of the gallium arsenide melt, respectively solidified at this position during the crystal growth process.

As can be gathered from FIG. 2, the silicon concentration in each wafer made of the crystal produced by the process according to the invention is about 2.5-fold higher than in a wafer of the corresponding axial position of the crystal produced according to the conventional process, although the totally added amount of dopant is almost the same for both crystals. Strictly speaking, the amount was even slightly lower in the sample according to the invention. The higher silicon concentration leads to a higher charge carrier concentration (see FIG. 4), to a lower electric resistivity (see FIG. 5), and to a higher electrical conductivity (see FIG. 6) of the crystal or the wafer according to the invention. FIG. 3 shows that the boron content could be decreased by a factor of 2-3, in spite of a higher silicon concentration achievable in the crystal. Due to the thus reduced concentration of compensation defects, the hall mobility is significantly enhanced according to the invention (see FIG. 7).

An enhancement or increase of the hall mobility in the wafers having a relatively large diameter according to the invention is of particular high value, in particular in a desirable charge carrier concentration range of higher than $1 \times 10^{18}$ cm-3, and in particular in the range of $1.0 \times 10^{18}$ cm$^{-3}$ to $2.0 \times 10^{18}$ cm$^{-1}$, because in this range of charge carrier concentration (which is achievable according to the invention by a concentration of a conductivity-generating dopant of at least $1 \times 10^{18}$ atoms/cm$^3$ and, even better, of at least $1.5 \times 10^{18}$ atoms/cm$^3$) the hall mobility is always at least 1,900 cm$^2$/Vs. Even better, for the case of a charge carrier concentration of 1.0 to $1.2 \times 10^{18}$ cm$^{-3}$, the hall mobility is higher than 2,100 cm$^2$/Vs, and for the case of a charge carrier concentration of higher than $1.2 \times 10^{18}$ cm-3, in particular in the range of $1.3 \times 10^{18}$ cm$^{-3}$ to $1.8 \times 10^{18}$ cm$^{-3}$, it is higher than 1,900 cm$^2$/Vs and even at least 2,000 cm$^2$ Vs.

These conditions of the ratio of hall mobility to charge carrier concentration are not satisfied in the comparative wafers.

The foregoing description of preferred embodiments of the invention has been presented for purposes of illustration and description only. It is not intended to be exhaustive or to limit the invention to the precise form disclosed, and modifications and variations are possible and/or would be apparent in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and that the claims encompass all embodiments of the invention, including the disclosed embodiments and their equivalents.

What is claimed is:

1. An n-type III-V semiconductor single crystal ingot having a diameter of at least about 100 mm, wherein the ingot is produced by a process of vertically directed solidification of a melt of semiconductor material, in which process the semiconductor melt was covered by a cover melt, and wherein the ingot satisfies the following conditions within its cylindrical part at each axial position corresponding to mass fractions g of solidified melt between 0.1 and 0.9:
    a concentration of an electrical conductivity-generating dopant in a range of about $1 \times 10^{18}$ atoms/cm$^3$ to $5 \times 10^{19}$ atoms/cm$^3$,
    a concentration of an impurity, which is present due to the manufacturing process for the single crystal from the cover melt, in a range of about $1 \times 10^{17}$ atoms/cm$^3$ to $5 \times 10^{18}$ atoms/cm$^3$, and
    an electrical conductivity of at least about 250 Siemens/cm, and/or a specific resistivity of at most about $4 \times 10^{-3}$ Ωcm.

2. An n-type III-V semiconductor single crystal ingot according to claim 1, wherein the III-V semiconductor single crystal has an electrical conductivity of at least about 250 Siemens/cm and a specific resistivity of at most about $4 \times 10^{-3}$ Ωcm.

3. An n-type III-V semiconductor single crystal ingot according to claim 1, wherein
    the concentration of the electrical conductivity-generating dopant is in a range of about $2 \times 10^{18}$ atoms/cm$^3$ to $1 \times 10^{19}$ atoms/cm$^3$, and/or
    the concentration of an impurity, which is present due to the manufacturing process, is in a range of about $1 \times 10^{17}$ atoms/cm$^3$ to $3.5 \times 10^{18}$ atoms/cm$^3$.

4. A III-V semiconductor single crystal ingot having a diameter of at least about 100 mm, wherein the ingot is produced by a process of vertically directed solidification of a melt of semiconductor material, wherein the semiconductor melt is covered by a cover melt, and wherein the ingot satisfies the following conditions within its cylindrical part at each axial position corresponding to mass fractions g of solidified melt between 0.1 and 0.9:
    a concentration of an electrical conductivity-generating dopant in a range of about $1 \times 10^{18}$ atoms/cm$^3$ to $5 \times 10^{19}$ atoms/cm$^3$;
    a concentration of an impurity that is present due to the manufacturing process for the single crystal from the cover melt is contained at a concentration in a range of about $1 \times 10^{17}$ atoms/cm$^3$ to $5 \times 10^{18}$ atoms/cm$^3$; and
    a charge carrier concentration of at least about $1.0 \times 10^{18}$ cm$^{-3}$, wherein the Hall mobility, determined according to ASTM F76-86, for the case of a charge carrier concentration of 1.0 to $1.2 \times 10^{18}$ cm$^{-3}$ is higher than 2,100 cm$^2$/Vs, and for the case of a charge carrier concentration of higher than $1.2 \times 10^{18}$ cm$^{-3}$ is higher than 1,900 cm$^2$/Vs.

5. A III-V semiconductor single crystal ingot according to claim 4, wherein in a range of a charge carrier concentration of 1.3 to $1.8 \times 10^{18}$ cm$^{-3}$, the Hall mobility is at least 2,000 cm$^2$/Vs.

6. A III-V semiconductor single crystal ingot according to claim 4, wherein the concentration of the electrical conductivity-generating dopant is in a range of about $1.5 \times 10^{18}$ atoms/cm$^3$ to $1 \times 10^{19}$ atoms/cm$^3$.

7. A III-V semiconductor single crystal ingot according to claim 6, wherein the dopant comprises silicon, and/or wherein the impurity comprises Boron.

8. A III-V semiconductor single crystal ingot according to claim 4, wherein the III-V semiconductor compound comprises GaAs.

9. A III-V semiconductor single crystal ingot according to claim 4, which is produced according to a VGF or a VB process utilizing a cover melt.

10. A III-V semiconductor single crystal ingot according to claim 4, wherein the crystal is produced by the process of solidifying a melt of semiconductor material using a seed crystal of the same semiconductor material as the semiconductor single crystal to be manufactured, in a crucible comprising a tapered portion and a cylindrical portion; and adding an amount of dopant to the semiconductor material prior to formation of the semiconductor single crystal, to adjust an electrical conductivity in the semiconductor single crystal, wherein at least a portion of the amount of dopant is added to the semiconductor melt
(a) after growth of semiconductor single crystal onto the seed crystal has started, or
(b) after at least partial solidification of semiconductor single crystal in the tapered portion of the crucible.

11. A substrate wafer, formed from an n-type III-V semiconductor single crystal ingot according to claim 1.

12. A substrate wafer, formed from a III-V semiconductor single crystal ingot according to claim 4.

13. The semiconductor of claim 1,
wherein the semiconductor single crystal ingot is produced by:
    solidifying a melt of semiconductor material using a seed crystal of the same semiconductor material as the semiconductor single crystal to be manufactured, in a crucible comprising a tapered portion and a cylindrical portion; and
    adding an amount of dopant to the semiconductor material prior to formation of the semiconductor single crystal, to adjust an electrical conductivity in the semiconductor single crystal; and
wherein at least a portion of the amount of dopant is added to the semiconductor melt
(a) after the growth of semiconductor single crystal onto the seed crystal has started, or
(b) after at least partial solidification of the semiconductor single crystal in the tapered portion of the crucible.

* * * * *